US012756331B2

(12) United States Patent
Xiao et al.

(10) Patent No.: US 12,756,331 B2
(45) Date of Patent: Oct. 6, 2026

(54) DIRECT CONTROL METHOD AND SYSTEM FOR INTERNAL POTENTIAL OF BRIDGE ARM OF NEW ENERGY GRID-TIED INVERTER

(71) Applicant: SOUTHEAST UNIVERSITY, Nanjing (CN)

(72) Inventors: Huafeng Xiao, Nanjing (CN); Xu Wu, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 107 days.

(21) Appl. No.: 19/017,286

(22) Filed: Jan. 10, 2025

(65) Prior Publication Data

US 2025/0150004 A1 May 8, 2025

Related U.S. Application Data

(63) Continuation of application No. PCT/CN2024/072280, filed on Jan. 15, 2024.

(51) Int. Cl.

| | |
|---|---|
| ***H02M 7/538*** | (2007.01) |
| ***G01R 29/12*** | (2006.01) |
| ***H02M 1/12*** | (2006.01) |
| ***H02M 7/483*** | (2007.01) |
| ***H02M 7/5387*** | (2007.01) |

(52) U.S. Cl.

CPC ........ *H02M 7/53873* (2013.01); *G01R 29/12* (2013.01); *H02M 1/12* (2013.01); *H02M 7/483* (2013.01)

(58) Field of Classification Search

CPC .... H02M 7/53873; H02M 1/12; H02M 7/483; H02M 1/0025; H02M 7/53871; G01R 29/12; H02J 3/38

See application file for complete search history.

(56) References Cited

U.S. PATENT DOCUMENTS

| | | | | |
|---|---|---|---|---|
| 11,601,052 | B2 * | 3/2023 | Sreenivas ........... | H02M 1/0009 |
| 2019/0103743 | A1 * | 4/2019 | Sun ...................... | G05B 19/042 |
| 2023/0369865 | A1 * | 11/2023 | Hart ........................ | H02J 3/001 |

* cited by examiner

*Primary Examiner* — Kyle J Moody

(57) ABSTRACT

Disclosed is a direct control method and system for an internal potential of a bridge arm of a new energy grid-tied inverter (GTI), the control method including the following steps. Measured values are obtained by measuring a port voltage and a port current of a GTI, instantaneous active and reactive power values are calculated, and a phase angle and amplitude reference of an internal potential of a bridge arm are obtained to generate reference values thereof. The internal potential of the bridge arm is estimated, and an estimated value used as a feedback signal, after being compared with the reference values, is sent to an internal potential controller to obtain a modulating signal, which is sent to a pulse width modulation (PWM) module, realizing direct control of the internal potential of the bridge arm. In the present disclosure, the dynamic performance of the GTI is improved while improving power quality.

10 Claims, 8 Drawing Sheets

DIRECT CONTROL METHOD AND SYSTEM FOR INTERNAL POTENTIAL OF BRIDGE ARM OF NEW ENERGY GRID-TIED INVERTER

CROSS-REFERENCE TO RELATED APPLICATIONS

This application is a continuation of PCT/CN2024/072280, filed on Jan. 15, 2024 and claims priority of Chinese Patent Application No. 202310171134.9, filed on Feb. 27, 2023, the entire contents of which are incorporated herein by reference.

TECHNICAL FIELD

The present disclosure is in the technical field of grid-tied inverter (GTI) control, and in particular relates to a direct control method and system for an internal potential of a bridge arm of a new energy GTI.

BACKGROUND

The grid-following GTI features fast power regulation speed and high utilization rate of renewable energy. However, generally with the maximum active power output as the main operation target, the grid-following GTI fails to support the power grid voltage and frequency stability as the traditional synchronous generator does. As the permeability of the new energy power generation develops increasingly, the power grid has gradually changed from strong power grid to weak power grid. To enhance the adaptability of GTI under complex operating conditions, the grid-forming inverter has come into being.

The grid-forming inverter has the potential to simulate the damping and inertia of the traditional synchronous generator, and can provide frequency and voltage support for the power grid. However, the grid-forming inverter face the risk of oscillation in the case of strong grid, which leads to the instability of grid-tied system.

The existing grid-forming inverter is generally designed with a control structure of voltage and current double inner loops, which faces the risk of oscillation in the case of strong grid. To realize the stable operation under the condition of strong grid, virtual inductance generally needs to be added. The virtual inductance requires a differential operation on the sampled current and therefore requires low-pass filtering of the sampled current, but the addition of the low-pass filtering deteriorates the dynamic performance.

SUMMARY

Given the deficiency of the prior art, an objective of the present disclosure is to provide a direct control method and system for an internal potential of a bridge arm of a new energy GTI to promote the dynamic performance of a GTI and improve power quality.

The objective of the present disclosure can be achieved by the following technical solutions.

A direct control method for an internal potential of a bridge arm of a new energy GTI is provided. Topological structures of the GTI include a direct current (DC)-side power supply, a three-phase inverter, a three-phase power grid impedance and a three-phase power grid; and the three-phase inverter includes a three-phase inverter circuit, a three-phase inductor-capacitor (LC) filter, a three-phase voltage sensor, a three-phase current sensor and a three-phase inverter controller; and the method includes the following steps:

collecting a three-phase voltage of a filtering capacitor of the three-phase LC filter and a three-phase current of a filtering inductor of the three-phase LC filter using the three-phase voltage sensor and the three-phase current sensor, respectively, and taking the three-phase voltage of the filtering capacitor of the three-phase LC filter and the three-phase current of the filtering inductor of the three-phase LC filter as an inverter port voltage $v_{abc}$ and an inverter port current $i_{abc}$, respectively;

calculating active power p and reactive power q output by the inverter according to the port voltage $v_{abc}$ and the port current $i_{abc}$ of the inverter;

taking the port voltage $v_{abc}$ and the port current $i_{abc}$ of the inverter as inputs, and estimating an internal potential $$u'_\phi$$

of a bridge arm of the inverter using an observer;

generating a phase angle reference θ and an amplitude reference U of the internal potential of the bridge arm according to the active power p and the reactive power q;

obtaining an internal potential reference value up-ref through an internal potential calculation formula according to the phase angle reference θ and the amplitude reference U of the internal potential;

obtaining a modulating wave $v_{mabc}$ after comparing the internal potential reference value $u_{\phi\text{-}ref}$ with an internal potential estimation value $$u'_\phi;$$

and sending the modulating wave $v_{mabc}$ into a pulse width modulation (PWM) module to generate drive signals to control the inverter.

Further, collected signal analog quantity is converted into digital quantity and transmitted to the three-phase inverter controller after collecting the port voltage $v_{abc}$ and the port current $i_{abc}$ of the inverter.

Further, the calculating active power p and reactive power q output by the inverter includes the following steps:

S21, converting the port voltage $v_{abc}$ and the port current $i_{abc}$ of the inverter from a three-phase stationary coordinate system to a two-phase stationary coordinate system;

a transformation formula for converting a three-phase stationary coordinate system voltage to a two-phase stationary coordinate system voltage being as follows:

$$\begin{bmatrix} v_\alpha \\ v_\beta \end{bmatrix} = \begin{bmatrix} \frac{2}{3} & -\frac{1}{3} & -\frac{1}{3} \\ 0 & \frac{1}{\sqrt{3}} & \frac{-1}{\sqrt{3}} \end{bmatrix} \begin{bmatrix} v_a \\ v_b \\ v_c \end{bmatrix}$$

a transformation formula for converting a three-phase stationary coordinate system current to a two-phase stationary coordinate system current being as follows:

$$\begin{bmatrix} i_\alpha \\ i_\beta \end{bmatrix} = \begin{bmatrix} \frac{2}{3} & -\frac{1}{3} & -\frac{1}{3} \\ 0 & \frac{1}{\sqrt{3}} & \frac{-1}{\sqrt{3}} \end{bmatrix} \begin{bmatrix} i_a \\ i_b \\ i_c \end{bmatrix}$$

S22, obtaining the active power p and the reactive power q output by the inverter through an instantaneous power calculation formula, the instantaneous power calculation formula being as follows:

$$\begin{aligned} p &= 1.5 \times (v_\alpha i_\alpha + v_\beta i_\beta) \\ q &= 1.5 \times (v_\beta i_\alpha - v_\alpha i_\beta) \end{aligned}.$$

Further, the estimating an internal potential u' of a bridge arm of the inverter using an observer includes the following specific processes:

S31, establishing a state equation of the internal potential of the bridge arm of the inverter $u_\phi$, the inverter port voltage $v_{abc}$ and the inverter port current $i_{abc}$ according to the Kirchhoff voltage law and Kirchhoff current law;

$$\begin{cases} \dot{X} = AX + Bu \\ y = CX \end{cases} \text{ where}$$

$$A = \begin{bmatrix} -\frac{R_L}{L} & \frac{1}{L} \\ 0 & 0 \end{bmatrix}, B = \begin{bmatrix} -\frac{1}{L} \\ 0 \end{bmatrix}, C = [1 \quad 0], y = i_L, u = v, \text{ and } X = \begin{bmatrix} i_L \\ u_\phi \end{bmatrix},$$

$R_L$ being branch resistance values of filtering inductor, L is a filtering inductance value, $i_L$ is an inverter-side inductor current, and up is a base value of the internal potential of the bridge arm of the inverter;

S32, establishing an observer equation according to an observer theory, determining an eigenvalue of an observed system according to a mathematical model of the inverter, and further designing an eigenvalue of an observer according to a state observer theory to cause the eigenvalue of the observer to be more negative than the eigenvalue of the observed system, a state of the observer converging to a state of the observed system; and S33, observing the internal potential of the bridge arm of the inverter using the observer, taking the port voltage and the port current of the inverter as inputs of the observer, and taking the internal potential of the bridge arm of the inverter as an output of the observer.

Further, the observer equation is as follows:

$$\begin{cases} \dot{\hat{X}} = A\hat{X} + Bu - H(\hat{y} - y) \\ \dot{\hat{y}} = C\hat{X} \end{cases}$$

where $\hat{X}$ is a state observation quantity of the observer, $\hat{y}$ is an output observation quantity of the observer, and $H=[h_1 \ h_2]^T$ is a feedback gain matrix of the state observer;

a characteristic equation of the observer is as follows:

$$\begin{vmatrix} \lambda + \frac{R}{L} + h_1 & -\frac{1}{L} \\ h_2 & \lambda \end{vmatrix} = \lambda^2 + \left(\frac{R}{L} + h_1\right)\lambda + \frac{1}{L}h_2 = 0$$

assuming that the two characteristic roots are negative real numbers k, the feedback gain matrix is as follows:

$$H = \begin{bmatrix} h_1 \\ h_2 \end{bmatrix} = \begin{bmatrix} -2k - \frac{R}{L} \\ k^2 L \end{bmatrix}$$

as the corresponding k is larger, a negative real root is farther away from a real axis, and a convergence speed is faster.

Further, the generating a phase angle reference θ and an amplitude reference U of the internal potential of the bridge arm includes the following steps:

S41, calculating and obtaining the phase angle reference θ of the internal potential of the bridge arm according to an active power loop calculation formula, the active power loop calculation formula being as follows:

$$\theta = \frac{P_{set} - p + \omega_n^2 D_p}{J\omega_n s^2 + \omega_n D_p s}$$

where $P_{set}$ is a reference value of the active power output by the three-phase inverter, $\omega_n$ is a rated angular frequency of the three-phase power grid, $D_p$ is an active damping coefficient, J is a virtual moment of inertia, and s is a laplace operator; and S42, calculating and obtaining the amplitude reference U of the internal potential of the bridge arm according to a reactive power loop calculation formula, the reactive power loop calculation formula being as follows:

$$U = \frac{1}{Ks}[D_q(v_n - v_{Amp}) + (Q_{set} - q)]$$

where $Q_{set}$ is a reference value of the reactive power output by the three-phase inverter, $v_n$ is a rated voltage amplitude of the three-phase power grid, $D_q$ is a reactive damping coefficient, K is a reactive inertia coefficient, and s is the laplace operator.

Further, the internal potential calculation formula is as follows:

$$u_{\phi-ref} = \begin{bmatrix} u_{\phi-ref\_a} \\ u_{\phi-ref\_b} \\ u_{\phi-ref\_c} \end{bmatrix} = \begin{bmatrix} U\cos(\theta) \\ U\cos\left(\theta - \frac{2}{3}\pi\right) \\ U\cos\left(\theta + \frac{2}{3}\pi\right) \end{bmatrix}.$$

Further, the obtaining a modulating wave $v_{mabc}$ includes the following specific processes: obtaining a deviation by subtracting the internal potential estimation value $$u'_\phi$$

from the internal potential reference value $u_{\phi-ref}$, and obtaining the modulating wave by inputting the deviation to a proportional-integral regulator.

Further, the generating drive signals includes the following specific processes: comparing the modulating wave $v_{mabc}$ with a three-phase triangular carrier, and generating the drive signals by a space vector pulse width modulation (SVPWM) method.

A direct control system for an internal potential of a bridge arm of a new energy GTI includes the following:

- a signal acquisition module, configured to use a three-phase voltage sensor and a three-phase current sensor to collect a three-phase voltage of a filtering capacitor of the three-phase LC filter and a three-phase current of a filtering inductor of the three-phase LC filter, respectively, and take the three-phase voltage of the filtering capacitor of the three-phase LC filter and the three-phase current of the filtering inductor of the three-phase LC filter as an inverter port voltage $v_{abc}$ and an inverter port current $i_{abc}$, respectively;
- a power calculation module, configured to calculate an active power p and a reactive power q output by the inverter according to the port voltage $v_{abc}$ and the port current $i_{abc}$ of the inverter;
- a state observer module, configured to take the port voltage $v_{abc}$ and the port current $i_{abc}$ of the inverter as inputs, and estimate an internal potential $$u'_\phi$$

of a bridge arm of the inverter by an observer;
- a power control module, configured to generate a phase angle reference θ and an amplitude reference U of the internal potential of the bridge arm according to the active power p and the reactive power q;
- an internal potential reference production module, configured to calculate an internal potential reference value $u_{\phi\text{-}ref}$ through an internal potential calculation formula according to an internal potential phase angle reference θ and an internal potential amplitude reference U;
- an internal potential regulation module, configured to compare the internal potential reference value $u_{\phi\text{-}ref}$ with an internal potential estimation value $u'_\phi$ to obtain a modulating wave $v_{mabc}$; and
- a PWM module, configured to generate drive signals to control the inverter after the modulating wave $v_{mabc}$ is sent to the PWM module.

Advantageous effects of the present disclosure are as follows. According to the present disclosure, the direct control of the internal potential of the bridge arm of the GTI is realized by observing the internal potential of the bridge arm of the three-phase inverter with the observer. The method of the present disclosure results in a smaller phase delay than the current calculation method for the internal potential of the bridge arm, and can improve the dynamic performance of the GTI. At the same time, compared with the current calculation method for the internal potential of the bridge arm, the method of the present disclosure preserves the high-frequency characteristics of internal potential, has less harmonic content of inverter output current, and can improve the power quality.

BRIEF DESCRIPTION OF THE DRAWINGS

To explain the examples of the present disclosure or the technical solutions in the prior art more clearly, a brief description will be given below with reference to the accompanying drawings which are used in the description of the examples or the prior art. Obviously, other drawings can be obtained according to these drawings without creative efforts for those ordinary skilled in the art.

DETAILED DESCRIPTION

Technical solutions in the examples of the present disclosure will be described clearly and completely in the following with reference to the accompanying drawings in the examples of the present disclosure. Obviously, the described examples are only some, rather than all examples of the present disclosure. On the basis of the examples in the present disclosure, all other examples obtained by those ordinary skilled in the art without creative efforts belong to the protection scope of the present disclosure.

Figure 1:
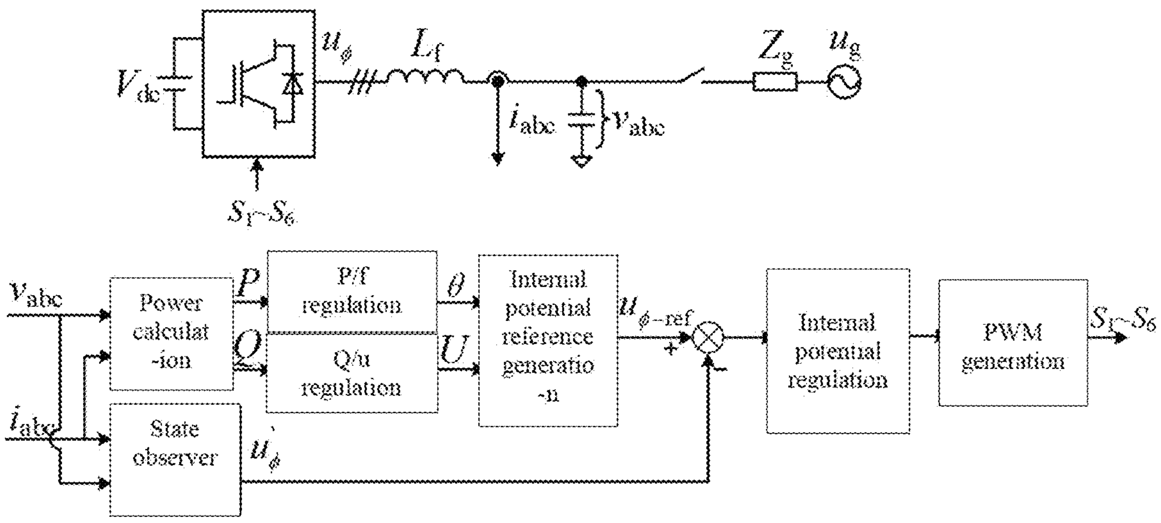
FIG. 1 is a schematic diagram of a circuit topology and a control method of a three-phase GTI according to the present disclosure.

As shown in FIG. 1, a direct control method for an internal potential of a bridge arm of a new energy GTI is provided. Topological structures of the GTI to which the control method is applied include a DC-side power supply, a three-phase inverter, a three-phase power grid impedance and a three-phase power grid. The three-phase inverter includes a three-phase inverter circuit, a three-phase LC filter, a three-phase voltage sensor, a three-phase current sensor and a three-phase inverter controller.

In the three-phase inverter, the three-phase inverter circuit is connected to the three-phase LC filter, the three-phase voltage sensor and the three-phase current sensor respectively sample a three-phase voltage of a filtering capacitor and a three-phase current of a filtering inductor of the three-phase LC filter, and transmit sample signals to the three-phase inverter controller; and the three-phase inverter controller outputs drive signals to control the three-phase inverter circuit after calculation.

A direct control method for an internal potential of a bridge arm of a new energy GTI includes the following steps.

S1, a port voltage $v_{abc}$ and a port current $i_{abc}$ of the inverter are collected; and the following specific processes are included.

S11, the three-phase voltage of the filtering capacitor of the three-phase LC filter is collected using the three-phase voltage sensor, and used as the port voltage $v_{abc}$ of the inverter, and the three-phase current of the filtering inductor of the three-phase LC filter is collected using the three-phase current sensor, and used as the port current $i_{abc}$ of the inverter.

S12, the port voltage $v_{abc}$ and the port current $i_{abc}$ of the inverter are converted from analog quantity into digital quantity and transmitted to the three-phase inverter controller.

S2, an active power p and a reactive power q output by the inverter are calculated using the port voltage $v_{abc}$ and the port current $i_{abc}$ of the inverter, and the following specific processes are included.

S21, the port voltage $v_{abc}$ and the port current $i_{abc}$ of the inverter are converted from a three-phase stationary coordinate system to a two-phase stationary coordinate system.

A transformation formula for converting a three-phase stationary coordinate system voltage to a two-phase stationary coordinate system voltage is as follows:

$$\begin{bmatrix} v_\alpha \\ v_\beta \end{bmatrix} = \begin{bmatrix} \frac{2}{3} & -\frac{1}{3} & -\frac{1}{3} \\ 0 & \frac{1}{\sqrt{3}} & \frac{-1}{\sqrt{3}} \end{bmatrix} \begin{bmatrix} v_a \\ v_b \\ v_c \end{bmatrix}.$$

A transformation formula for converting a three-phase stationary coordinate system current to a two-phase stationary coordinate system current is as follows:

$$\begin{bmatrix} i_\alpha \\ i_\beta \end{bmatrix} = \begin{bmatrix} \frac{2}{3} & -\frac{1}{3} & -\frac{1}{3} \\ 0 & \frac{1}{\sqrt{3}} & \frac{-1}{\sqrt{3}} \end{bmatrix} \begin{bmatrix} i_a \\ i_b \\ i_c \end{bmatrix}.$$

S22, the active power p and the reactive power q output by the inverter are obtained through an instantaneous power calculation formula, and the instantaneous power calculation formula is as follows:

$$\begin{aligned} p &= 1.5 \times (v_\alpha i_\alpha + v_\beta i_\beta) \\ q &= 1.5 \times (v_\beta i_\alpha - v_\alpha i_\beta) \end{aligned}.$$

S3, an internal potential of a bridge arm of the inverter us is estimated using an observer with the port voltage $v_{abc}$ and the port current $i_{abc}$ of the inverter as inputs, and the specific processes are included.

S31, a mathematical model of the inverter is established.

A state equation of the internal potential of the bridge arm of the inverter up, the port voltage $v_{abc}$ and the port current $i_{abc}$ of the inverter is established according to the Kirchhoff voltage law and Kirchhoff current law:

$$\begin{cases} \dot{X} = AX + Bu \\ y = CX \end{cases} \text{ where}$$

-continued $$A = \begin{bmatrix} -\frac{R_L}{L} & \frac{1}{L} \\ 0 & 0 \end{bmatrix}, B = \begin{bmatrix} -\frac{1}{L} \\ 0 \end{bmatrix}, C = [\,1 \;\; 0\,], y = i_L, u = v, \text{ and } X = \begin{bmatrix} i_L \\ u_\phi \end{bmatrix}.$$

$R_L$ are branch resistance values of filtering inductor, L is a filtering inductance value, $i_L$ is an inverter-side inductor current, and $u_\phi$ is a base value of the internal potential of the bridge arm of the inverter.

S32, observer parameters are designed according to physical parameters and the mathematical model of the inverter.

Firstly, an observer equation is established according to an observer theory, and an eigenvalue of an observed system (i.e. an inverter system) is determined according to the mathematical model of the inverter. Eigenvalue of the observer is designed according to a state observer theory to cause the eigenvalue of the observer to be more negative than the eigenvalue of the observed system, and a state of the observer converges to a state of the observed system.

Figure 2:
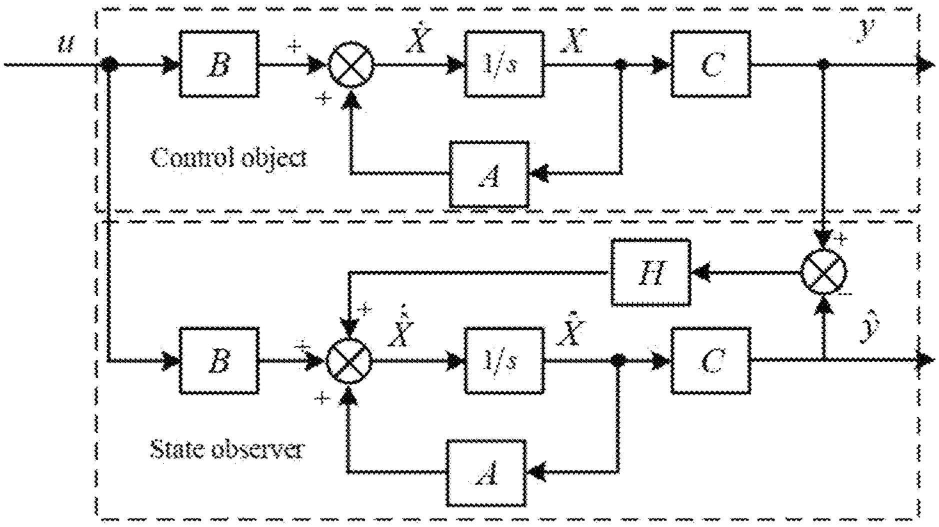
FIG. 2 is a schematic diagram of a state observer model according to the present disclosure.

The observer equation is as follows:

$$\begin{cases} \dot{\hat{X}} = A\hat{X} + Bu - H(\hat{y} - y) \\ \hat{y} = C\hat{X} \end{cases}$$

where $\hat{X}$ is a state observation quantity of the observer, $\hat{y}$ is an output observation quantity of the observer, and $H=[h_1\ h_2]^T$ is a feedback gain matrix of the state observer. $h_1$ is a feedback gain from a terminal voltage to an inductor current, and $h_2$ is a feedback gain from the terminal voltage to an internal potential. An observer model is shown in FIG. 2.

Figure 3:
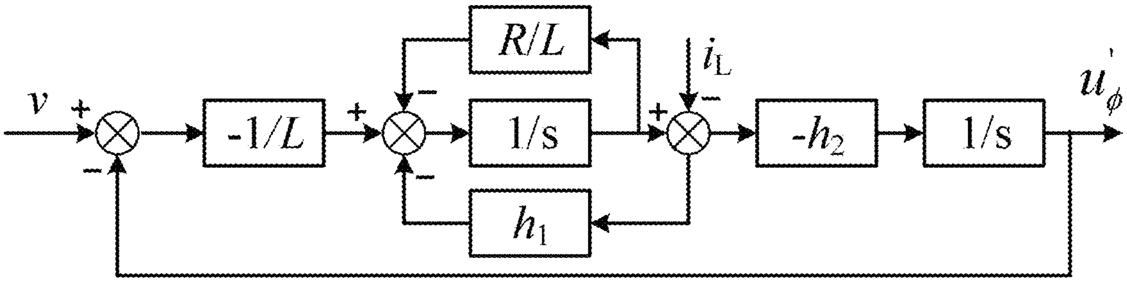
FIG. 3 is a schematic diagram of an internal potential observer model of a bridge arm of the three-phase GTI according to the present disclosure.

An internal potential observer model is obtained according to the observer equation, as shown in FIG. 3, and the characteristic equation of the observer is as follows:

$$\begin{vmatrix} \lambda + \frac{R}{L} + h_1 & -\frac{1}{L} \\ h_2 & \lambda \end{vmatrix} = \lambda^2 + \left(\frac{R}{L} + h_1\right)\lambda + \frac{1}{L}h_2 = 0.$$

Assuming that the two characteristic roots are negative real numbers k, the feedback gain matrix is as follows:

$$H = \begin{bmatrix} h_1 \\ h_2 \end{bmatrix} = \begin{bmatrix} -2k - \frac{R}{L} \\ k^2 L \end{bmatrix}.$$

As the corresponding k is larger, a negative real root is farther away from a real axis, and a convergence speed is faster.

S33, the internal potential of the bridge arm of the inverter is observed using the observer, the port voltage and the port current of the inverter are taken as inputs of the observer, and the internal potential of the bridge arm of the inverter is taken as an output of the observer.

S4, a phase angle reference θ and an amplitude reference U of the internal potential of the bridge arm are generated by adjusting the power according to the active power p and the reactive power q obtained in S2, and the following specific processes are included.

S41, a phase θ of a reference value of the internal potential of the bridge arm is calculated and obtained according to an active power loop calculation formula, and the active power loop calculation formula is as follows:

$$\theta = \frac{P_{set} - p + \omega_n^2 D_p}{J\omega_n s^2 + \omega_n D_p s}$$

where $P_{set}$ is a reference value of the active power output by the three-phase inverter, $\omega_n$ is a rated angular frequency of the three-phase power grid, $D_p$ is an active damping coefficient, J is a virtual moment of inertia, and s is a laplace operator.

S42, the amplitude reference U of the internal potential of the bridge arm is calculated and obtained according to a reactive power loop calculation formula, and the reactive power loop calculation formula is as follows:

$$U = \frac{1}{Ks}[D_q(v_n - v_{Amp}) + (Q_{set} - q)]$$

where $Q_{set}$ is a reference value of the reactive power output by the three-phase inverter, $v_n$ is a rated voltage amplitude of the three-phase power grid, $D_q$ is a reactive damping coefficient, K is a reactive inertia coefficient, and s is the laplace operator.

S5, the reference value $u_{\phi\text{-}ref}$ of the internal potential is obtained through an internal potential calculation formula according to the phase angle reference θ and the amplitude reference U of the internal potential, and the internal potential calculation formula is as follows:

$$u_{\phi-ref} = \begin{bmatrix} u_{\phi-ref\_a} \\ u_{\phi-ref\_b} \\ u_{\phi-ref\_c} \end{bmatrix} = \begin{bmatrix} U\cos(\theta) \\ U\cos\left(\theta - \frac{2}{3}\pi\right) \\ U\cos\left(\theta + \frac{2}{3}\pi\right) \end{bmatrix}.$$

S6, a modulating wave $v_{mabc}$ is obtained via an internal potential regulation module after comparing the internal potential reference value $u_{\phi\text{-}ref}$ obtained in S5 with the internal potential estimation value $$u'_\phi$$

obtained in S3; and the specific processes are as follows: a deviation is obtained by subtracting the internal potential estimation value $$u'_\phi$$

from the internal potential reference value $U_{\phi\text{-}ref}$, and the modulating wave is obtained by inputting the deviation to a proportional-integral regulator.

S7, the modulating wave $v_{mabc}$ obtained in S6 is sent to a PWM module to generate drive signals to control the inverter; and the specific processes are as follows: the modulating wave $v_{mabc}$ is compared with a three-phase triangular carrier, and the drive signals are generated by an SVPWM method.

Application Examples

The main circuit and inverter control method of a typical grid-tied system are shown in FIG. 1. The DC side of the main circuit part can be regarded as a DC source with constant voltage. A DC-alternating current (AC) conversion part is realized by a three-phase full-bridge inverter circuit formed by six insulated gate bipolar transistors (IGBTs), and the current output by the bridge arm is connected to the power grid after being filtered by an LC filter. In a sampling part, the port voltage and port current of the inverter are obtained through a sampling device. In an inverter control part, the port voltage and the port current of the inverter are input to a power calculation module to obtain an instantaneous output active power and reactive power of the inverter, the instantaneous output active power of the inverter is input to an active power/frequency (P/f) regulation module to obtain a reference phase of internal potential, and the instantaneous output reactive power of the inverter is input to a reactive power/voltage (Q/u) regulation module to obtain a reference amplitude of internal potential. The port voltage and port current of the inverter are input to the internal potential observer module to obtain the internal potential of the bridge arm of the inverter. The modulating wave is further obtained by the internal potential regulation module, and the drive signals are generated through SVPWM to drive IGBTs.

The main parameter values of this example are as follows, main circuit parameters: DC-side voltage $V_{dc}$=700 V, inverter-side filtering inductor L=150 uH, branch circuit of filtering inductor 0.01Ω, filtering capacitor C=600 uF, damping resistance Rd=0.2Ω, AC bus voltage rms value 315 V, AC bus voltage frequency $f_0$=50 Hz, inverter rated capacity 500 kW, and inverter switching frequency 3.2 kHz. Controller parameters: preset active power given $P_{set}$=500 kW, preset reactive power given $Q_{set}$=0 k Var, virtual moment of inertia J=0.3, reactive inertia coefficient K=318, active damping coefficient $D_p$=252.87, reactive damping coefficient $D_q$=2000, proportional coefficient of internal potential controller $K_{pe}$=150, integral coefficient of internal potential controller $K_{ie}$=200, proportional coefficient of current controller $K_{pi}$=0.64, and integral coefficient of current controller $K_{ii}$=100. The state observer portion: $h_1$=127933, $h_2$=614400, $k_a$=−6667, $k_b$=−614400, and $k_c$=127933.

To verify the effectiveness of the direct control technology of internal potential of bridge arm of new energy grid-tied inverter, a simulation model is built in MATLAB (MAtrix LABoratory)/Simulink to verify the effectiveness of the control method. The inverter runs in an off-grid mode from 0-0.1 s, and is tied to the grid at 0.1 s. The active power is preset as $P_{set}$=500 kW, and the reactive power is preset as 0 k Var.

Figure 4:
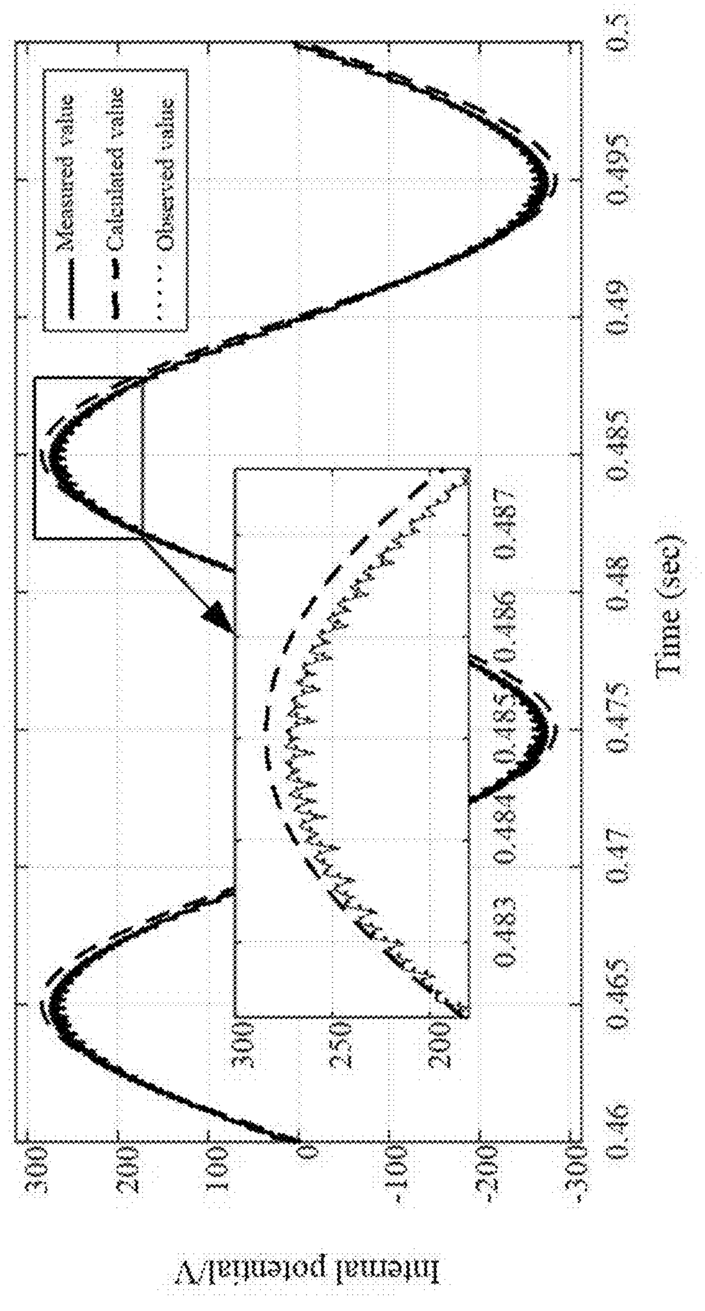
FIG. 4 is a diagram showing the effect of observing the internal potential of the bridge arm of the three-phase GTI according to an example of the present disclosure.

First, the effectiveness of the internal potential observer is verified by first-order low-pass filtering with a cut-off frequency of 1 kHz after sampling the midpoint voltage of the bridge arm. To eliminate the hysteresis effect caused by low-pass filtering, the internal potential observed by the internal potential observer is also subjected to the first-order low-pass filtering with a cut-off frequency of 1 kHz. FIG. 4 is a schematic diagram of the observation effect of the internal potential of the bridge arm of a three-phase GTI, in which a solid line is a fundamental component (reference) of the internal potential of the bridge arm obtained through measurement, a dashed line is calculated according to $$e = v + R_L i_L + L\frac{di_L}{dt},$$

and a dotted line is observed and obtained by the observer. It can be seen from FIG. 4 that the internal potential observer can accurately observe the internal potential of the bridge arm of the inverter, has no disadvantage of phase lag compared with the internal potential calculated according to the formula, and can restore partial high frequency characteristics of the internal potential of the bridge arm.

Figure 5:
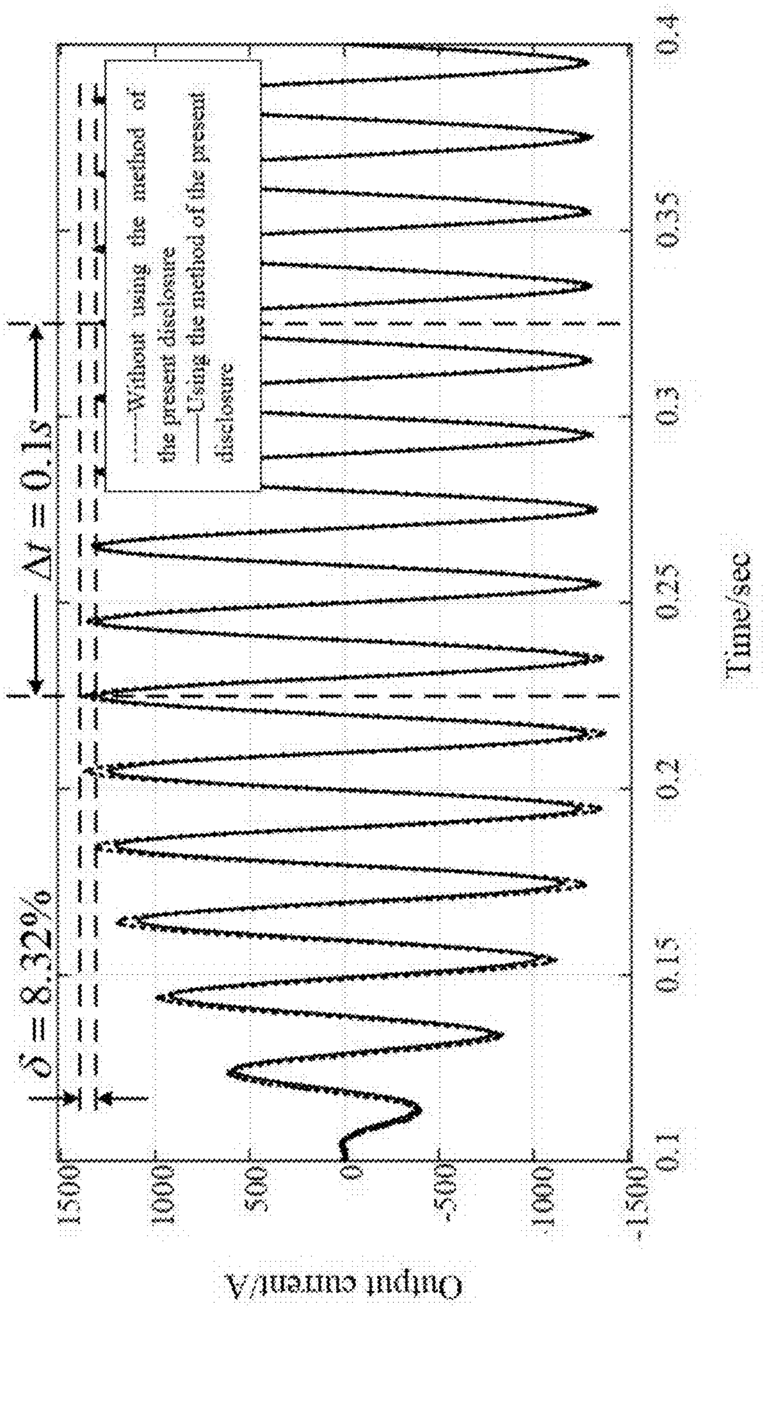
FIG. 5 is a diagram comparing dynamic responses of a port current of the inverter using and without using a method of the present disclosure.

FIG. 5 shows a comparison of dynamic responses of the port current of the inverter using and without using the method of the present disclosure. The solid line is an port current waveform of the inverter using the method of the present disclosure, and the dashed line is the port current waveform of the inverter without using the method of the present disclosure. It can be found by comparison that under the same control parameters, the port current of the inverter without using the method of the present disclosure has an overshoot of 8.32%, and takes additional 0.1 s to stabilize to the rated current compared with the port current of the inverter using the method of the present disclosure. It can be seen that the dynamic response of the inverter using the method of the present disclosure is better.

Figure 6:
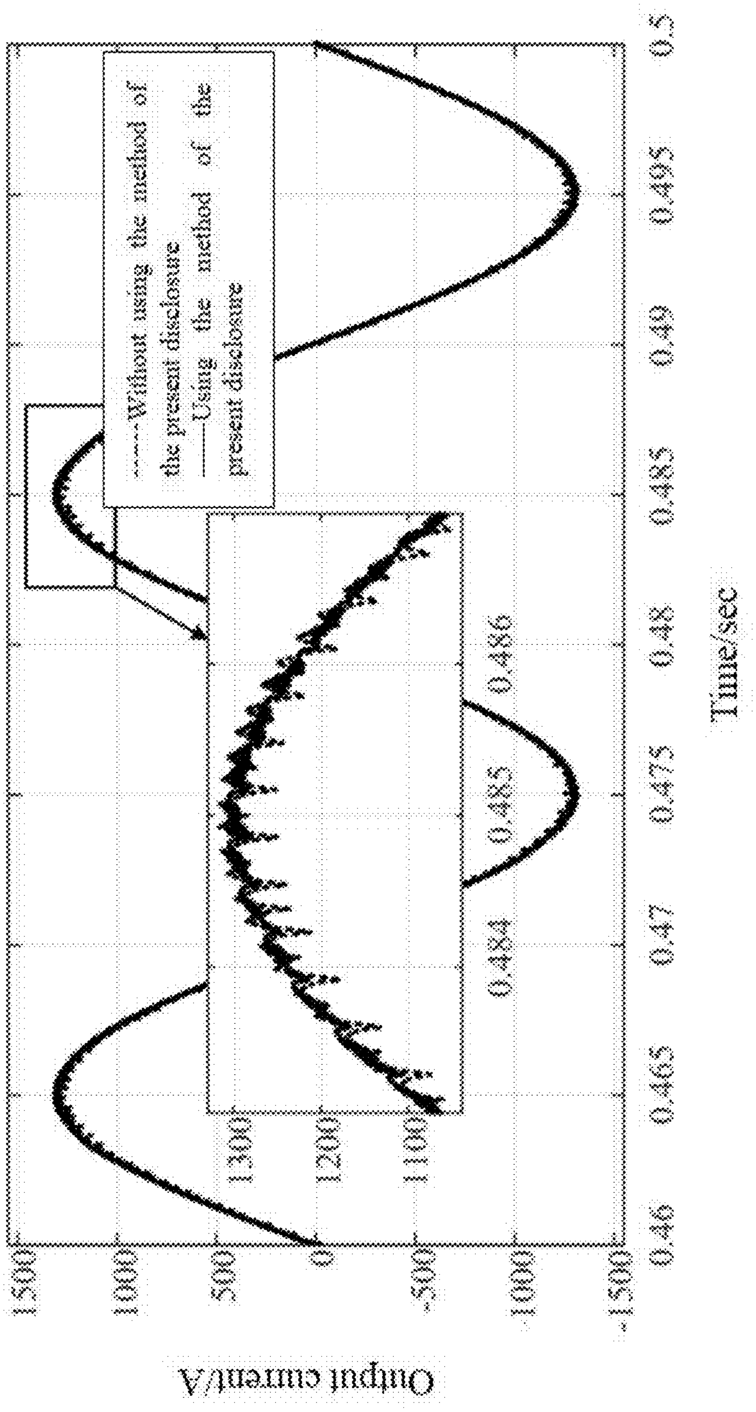
FIG. 6 is a diagram comparing the quality of the port current of the inverter using and without using the method of the present disclosure.

FIG. 6 shows a comparison of steady-state port current waveforms of the inverter under the same control parameters. The solid line is the port current waveform of the inverter using the method of the present disclosure, and the dashed line is the port current waveform of the inverter without using the method of the present disclosure. The comparison shows that the port current of the inverter using the method of the present disclosure has less high-frequency harmonic content, that is, the power quality is better.

Figure 7:
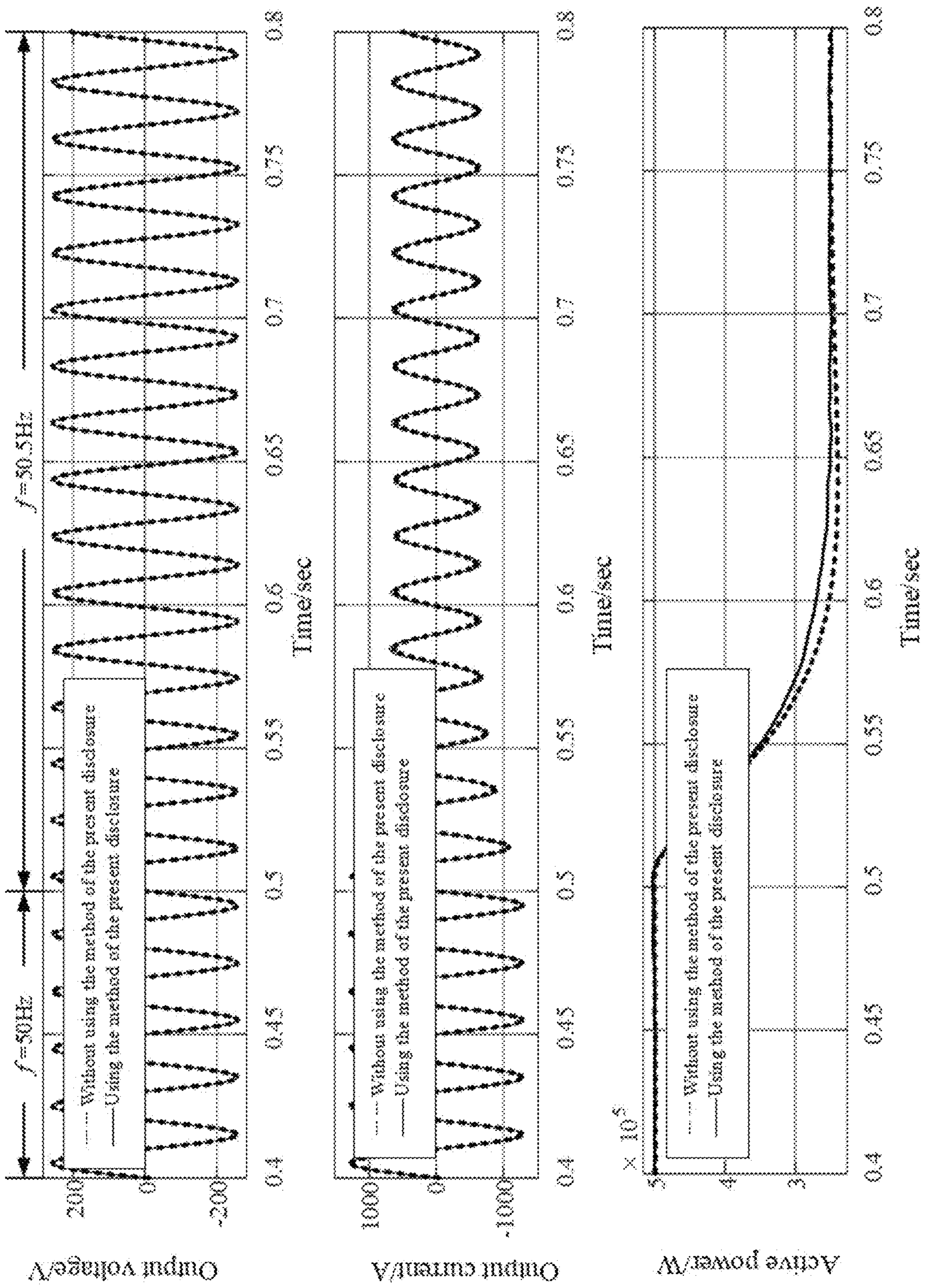
FIG. 7 shows waveforms of a port voltage, a port current and an active power of the inverter using and without the method of the present disclosure when a grid frequency abruptly jumps from 50 Hz to 50.5 Hz.

FIG. 7 shows a comparison of the port voltage, port current and output active power of the inverter using and without using the method of the present disclosure when the grid frequency rises suddenly from 50 Hz to 50.5 Hz under the same control parameters. The solid and dashed lines are waveforms of the port voltage, port current and output active power of the inverter, respectively, using and without using the method of the present disclosure. It is found by comparison that the method of the present disclosure can provide frequency support for the power grid without overshoot and with a good dynamic response.

Figure 8:
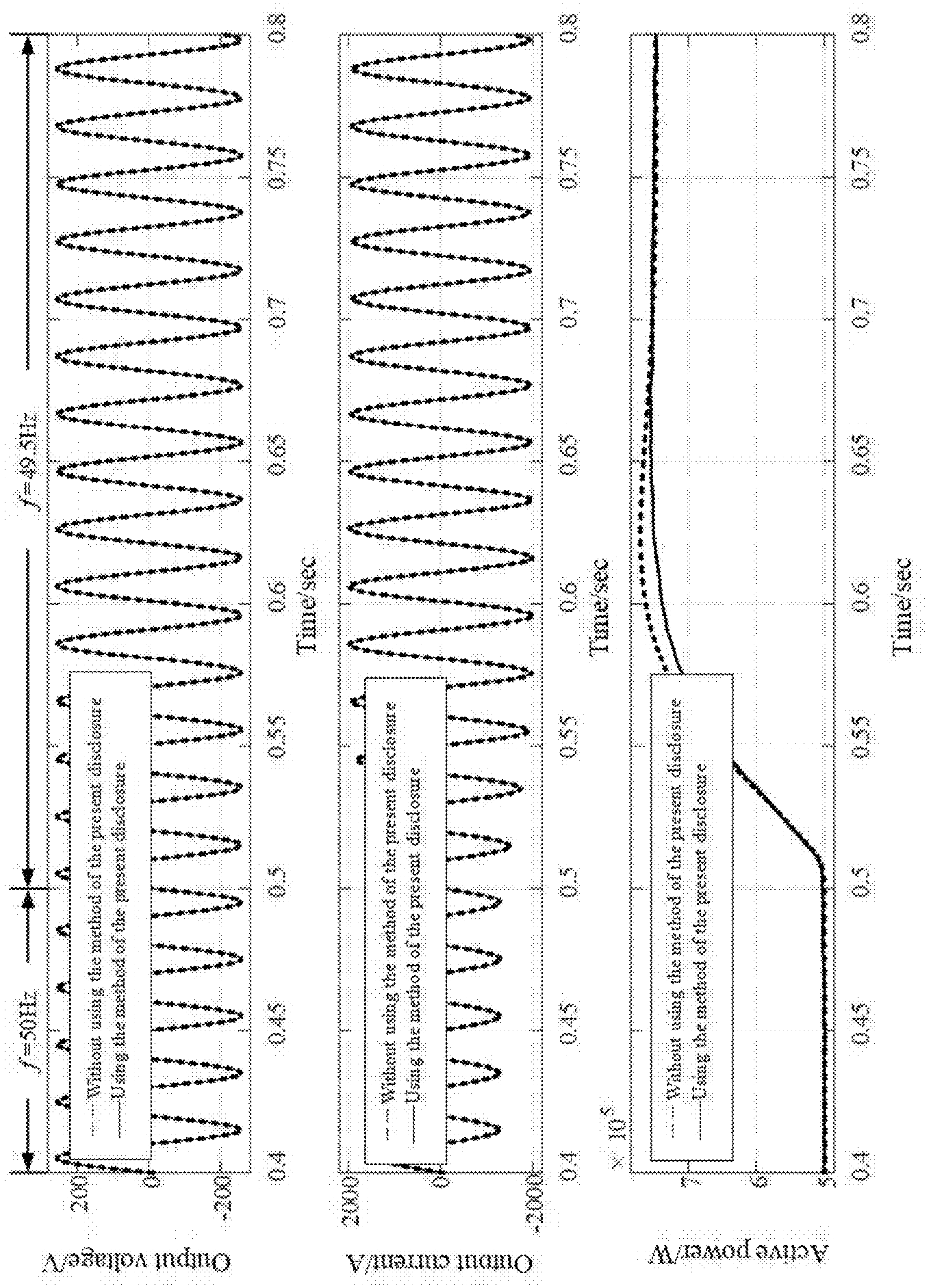
FIG. 8 shows the waveforms of the port voltage, the port current and the active power of the inverter using and without using the method of the present disclosure when the grid frequency abruptly drops from 50 Hz to 49.5 Hz.

FIG. 8 shows the comparison of the port voltage, port current and output active power of the inverter using and without using the method of the present disclosure when the grid frequency drops suddenly from 50 Hz to 49.5 Hz under the same control parameters. The solid and dashed lines are waveforms of the port voltage, port current and output active power of the inverter, respectively, using and without using the method of the present disclosure. It is found by comparison that the method of the present disclosure can provide frequency support for the power grid without overshoot and with a good dynamic response.

Figure 9:
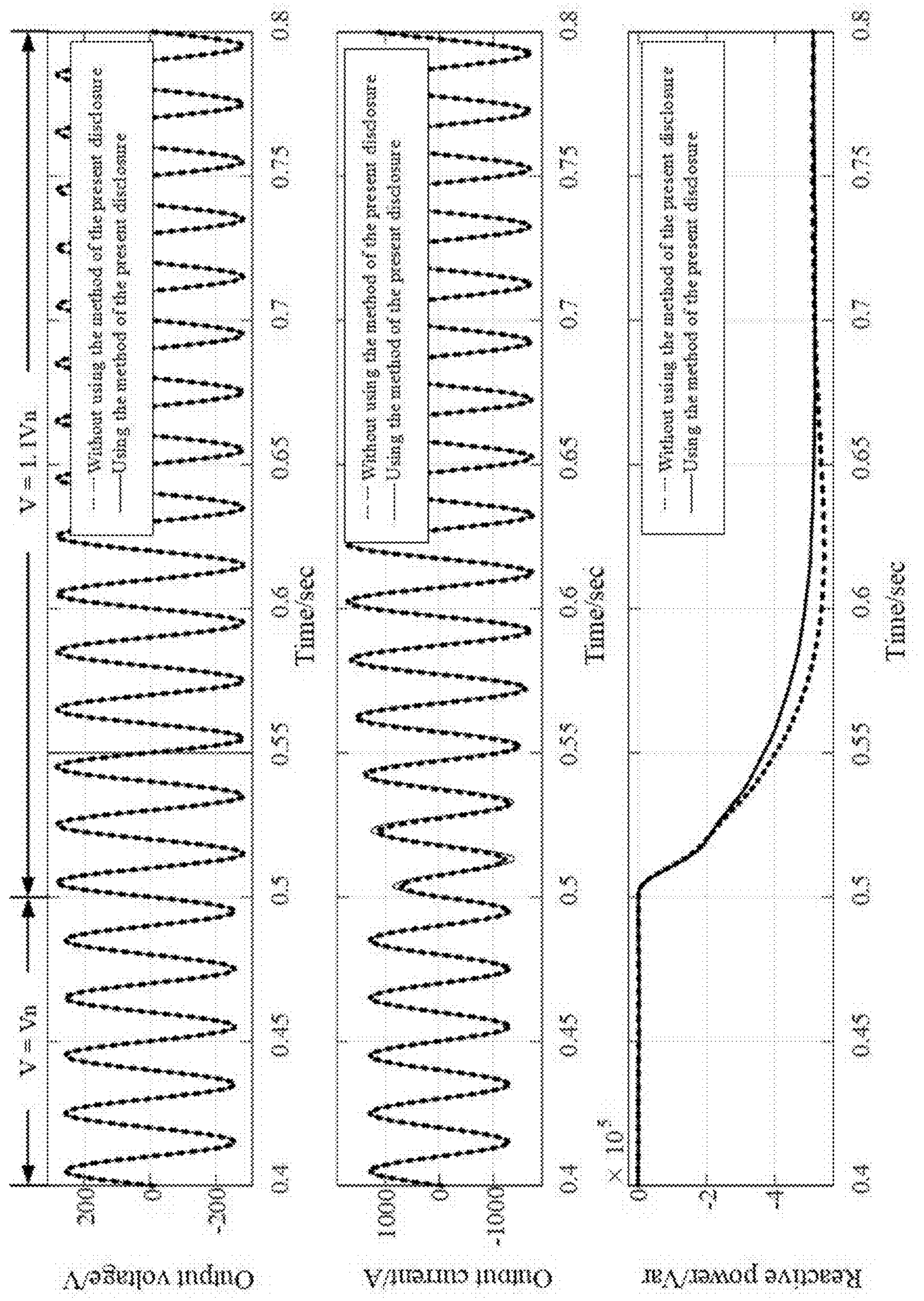
FIG. 9 shows the waveforms of the port voltage, the port current and a reactive power of the inverter using and without using the method of the present disclosure when a grid voltage suddenly drops from a rated voltage to 1.1 times the rated voltage.

FIG. 9 shows a comparison of the port voltage, port current and output active power of the inverter using and without using the method of the present disclosure when the grid voltage rises suddenly from the rated voltage to 1.1 times the rated voltage under the same control parameters. The solid and dashed lines are the waveforms of the port voltage, port current and output active power of the inverter, respectively, using and without using the method of the present disclosure. It is found by comparison that the method of the present disclosure can provide the voltage support for the power grid without overshoot and with a good dynamic response.

Figure 10:
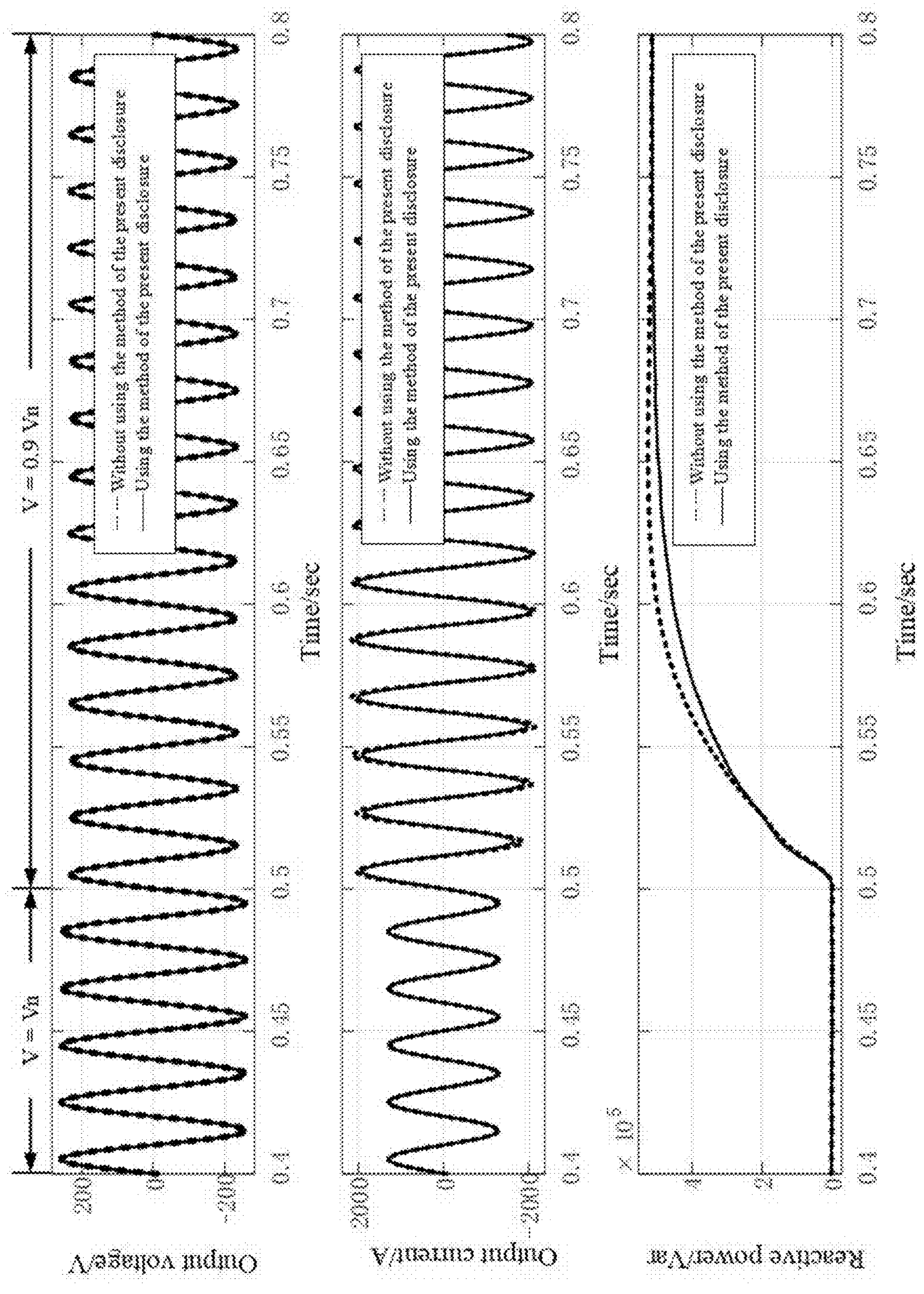
FIG. 10 shows the waveforms of the port voltage, the port current and a reactive power of the inverter using and without using the method of the present disclosure when the grid voltage drops suddenly from the rated voltage to 0.9 times the rated voltage.

FIG. 10 shows a comparison of the port voltage, port current and output active power of the inverter using and without using the method of the present disclosure when the grid voltage suddenly drops from the rated voltage to 0.9 times the rated voltage under the same control parameters. The solid and dashed lines are the waveforms of the port voltage, port current and output active power of the inverter, respectively, using and without using the method of the present disclosure. It is found by comparison that the method of the present disclosure can provide the voltage support for the power grid without overshoot and with a good dynamic response.

In the description of this specification, the description of the terms "an example", "an instance", "a specific instance", etc. mean that specific features, structures, materials, or characteristics described in connection with the example or instance are included in at least one example or instance of the present disclosure. In this specification, schematic representations of the above terms do not necessarily refer to the same example or instance. Furthermore, the specific features, structures, materials, or characteristics described may be combined in any suitable manner in any one or more examples or instances.

The basic principle, main features and advantages of the present disclosure have been shown and described above. It is to be understood by those skilled in the art that the present disclosure is not limited by the above examples, and what is described in the above examples and descriptions only illustrates the principles of the present disclosure. There will be various changes and improvements in the present disclosure without departing from the spirit and scope of the present disclosure, which fall within the scope of the claimed protection of the present disclosure.

The invention claimed is:

1. A direct control method for an internal potential of a bridge arm of a new energy grid-tied inverter (GTI), topological structures of the GTI comprising a direct current (DC)-side power supply, a three-phase inverter, a three-phase power grid impedance and a three-phase power grid, wherein the three-phase inverter comprises a three-phase inverter circuit, a three-phase inductor-capacitor (LC) filter, a three-phase voltage sensor, a three-phase current sensor and a three-phase inverter controller; and the method comprises the following steps:

collecting a three-phase voltage of a filtering capacitor of the three-phase LC filter and a three-phase current of a filtering inductor of the three-phase LC filter using the three-phase voltage sensor and the three-phase current sensor, respectively, and taking the three-phase voltage of the filtering capacitor of the three-phase LC filter and the three-phase current of the filtering inductor of the three-phase LC filter as an inverter port voltage $v_{abc}$ and an inverter port current $i_{abc}$, respectively;

calculating an active power p and a reactive power q output by the inverter according to the port voltage $v_{abc}$ and the port current $i_{abc}$ of the inverter;

taking the port voltage $v_{abc}$ and the port current $i_{abc}$ of the inverter as inputs, and estimating an internal potential $u'_\varphi$ of a bridge arm of the inverter using an observer;

generating a phase angle reference θ and an amplitude reference U of the internal potential of the bridge arm according to the active power p and the reactive power q;

obtaining an internal potential reference value $u_{\phi\text{-}ref}$ through an internal potential calculation formula according to the phase angle reference θ and the amplitude reference U of the internal potential;

obtaining a modulating wave $v_{mabc}$ after comparing the internal potential reference value $u_{\phi\text{-}ref}$ with an internal potential estimation value $u'_{\phi}$; and sending the modulating wave $v_{mabc}$ into a pulse width modulation (PWM) module to generate drive signals to control the inverter.

2. The direct control method for an internal potential of a bridge arm of a new energy GTI according to claim 1, wherein collected signal analog quantity is converted into digital quantity and transmitted to the three-phase inverter controller after collecting the port voltage $v_{abc}$ and the port current $i_{abc}$ of the inverter.

3. The direct control method for an internal potential of a bridge arm of a new energy GTI according to claim 1, wherein the calculating active power p and reactive power q output by the inverter comprises the following steps:

S21, converting the port voltage $v_{abc}$ and the port current $i_{abc}$ of the inverter from a three-phase stationary coordinate system to a two-phase stationary coordinate system;

a transformation formula for converting a three-phase stationary coordinate system voltage to a two-phase stationary coordinate system voltage being as follows:

$$\begin{bmatrix} v_\alpha \\ v_\beta \end{bmatrix} = \begin{bmatrix} \frac{2}{3} & -\frac{1}{3} & -\frac{1}{3} \\ 0 & \frac{1}{\sqrt{3}} & \frac{-1}{\sqrt{3}} \end{bmatrix} \begin{bmatrix} v_a \\ v_b \\ v_c \end{bmatrix}$$

a transformation formula for converting a three-phase stationary coordinate system current to a two-phase stationary coordinate system current being as follows:

$$\begin{bmatrix} i_\alpha \\ i_\beta \end{bmatrix} = \begin{bmatrix} \frac{2}{3} & -\frac{1}{3} & -\frac{1}{3} \\ 03 & \frac{1}{\sqrt{3}} & \frac{-1}{\sqrt{3}} \end{bmatrix} \begin{bmatrix} i_a \\ i_b \\ i_c \end{bmatrix}$$

S22, obtaining the active power p and the reactive power q output by the inverter through an instantaneous power calculation formula; the instantaneous power calculation formula being as follows:

$$p = 1.5 \times (v_\alpha i_\alpha + v_\beta i_\beta)$$

$$q = 1.5 \times (v_\beta i_\alpha - v_\alpha i_\beta).$$

4. The direct control method for an internal potential of a bridge arm of a new energy GTI according to claim 1, wherein the estimating an internal potential $$u'_\phi$$

of a bridge arm of the inverter using an observer comprises the following specific processes:

S31, establishing a state equation of the internal potential of the bridge arm of the inverter $u_\phi$, the inverter port voltage $v_{abc}$ and the inverter port current $i_{abc}$ according to the Kirchhoff voltage law and Kirchhoff current law;

$$\begin{cases} \dot{X} = AX + Bu \\ y = CX \end{cases} \text{ where}$$

$$A = \begin{bmatrix} -\frac{R_L}{L} & \frac{1}{L} \\ 0 & 0 \end{bmatrix}, B = \begin{bmatrix} -\frac{1}{L} \\ 0 \end{bmatrix}, C = [1 \ \ 0], y = i_L,$$

$$u = v, \text{ and } X = \begin{bmatrix} i_L \\ u_\phi \end{bmatrix},$$

$R_L$ being branch resistance values of filtering inductor, L being a filtering inductance value, $i_L$ being an inverter-side inductor current, and $u_\phi$ being a base value of the internal potential of the bridge arm of the inverter;

S32, establishing an observer equation according to an observer theory, determining an eigenvalue of an observed system according to a mathematical model of the inverter, and further designing an eigenvalue of the observer according to a state observer theory to cause the eigenvalue of the observer to be more negative than the eigenvalue of the observed system, a state of the observer converging to a state of the observed system; and S33, observing the internal potential of the bridge arm of the inverter using the observer, taking the port voltage and the port current of the inverter as inputs of the observer, and taking the internal potential of the bridge arm of the inverter as an output of the observer.

5. The direct control method for an internal potential of a bridge arm of a new energy GTI according to claim 4, wherein the observer equation is as follows:

$$\begin{cases} \dot{\hat{X}} = A\hat{X} + Bu - H(\hat{y} - y) \\ \hat{y} = C\hat{X} \end{cases}$$

where $\hat{X}$ is a state observation quantity of the observer, y is an output observation quantity of the observer, and $H=[h_1 \ h_2]^T$ is a feedback gain matrix of the state observer;

a characteristic equation of the observer is as follows:

$$\begin{vmatrix} \lambda + \frac{R}{L} + h_1 & -\frac{1}{L} \\ h_2 & \lambda \end{vmatrix} = \lambda^2 + \left(\frac{R}{L} + h_1\right)\lambda + \frac{1}{L}h_2 = 0$$

assuming that two characteristic roots are negative real numbers k, the feedback gain matrix is as follows:

$$H = \begin{bmatrix} h_1 \\ h_2 \end{bmatrix} = \begin{bmatrix} -2k - \frac{R}{L} \\ k^2 L \end{bmatrix}$$

as the corresponding k is larger, a negative real root is farther away from a real axis, and a convergence speed is faster.

6. The direct control method for an internal potential of a bridge arm of a new energy GTI according to claim 1, wherein the generating a phase angle reference θ and an amplitude reference U of the internal potential of the bridge arm comprises the following steps:

S41, calculating and obtaining the phase angle reference θ of the internal potential of the bridge arm according to an active power loop calculation formula, the active power loop calculation formula being as follows:

$$\theta = \frac{P_{set} - p + \omega_n^2 D_p}{J\omega_n s^2 + \omega_n D_p s}$$

where $P_{set}$ is a reference value of the active power output by the three-phase inverter, $\omega_n$ is a rated angular frequency of the three-phase power grid, $D_p$ is an active damping coefficient, J is a virtual moment of inertia, and s is a laplace operator; and S42, calculating and obtaining the amplitude reference U of the internal potential of the bridge arm according to a reactive power loop calculation formula, the reactive power loop calculation formula being as follows:

$$U = \frac{1}{Ks}[D_q(v_n - v_{Amp}) + (Q_{set} - q)]$$

where $Q_{set}$ is a reference value of the reactive power output by the three-phase inverter, $v_n$ is a rated voltage amplitude of the three-phase power grid, $D_q$ is a reactive damping coefficient, K is a reactive inertia coefficient, and s is the laplace operator.

7. The direct control method for an internal potential of a bridge arm of a new energy GTI according to claim 1, wherein the internal potential calculation formula is as follows:

$$u_{\phi-ref} = \begin{bmatrix} u_{\phi-ref\_a} \\ u_{\phi-ref\_b} \\ u_{\phi-ref\_c} \end{bmatrix} = \begin{bmatrix} U\cos(\theta) \\ U\cos\left(\theta - \frac{2}{3}\pi\right) \\ U\cos\left(\theta + \frac{2}{3}\pi\right) \end{bmatrix}.$$

8. The direct control method for an internal potential of a bridge arm of a new energy GTI according to claim 1, wherein the obtaining a modulating wave $v_{mabc}$ comprises the following specific processes: obtaining a deviation by subtracting the internal potential estimation value $$u'_\phi$$

from the internal potential reference value $u_{\phi-ref}$, and obtaining the modulating wave by inputting the deviation to a proportional-integral regulator.

9. The direct control method for an internal potential of a bridge arm of a new energy GTI according to claim 1, wherein the generating drive signals comprises the following specific processes: comparing the modulating wave $v_{mabc}$ with a three-phase triangular carrier, and generating the drive signals by a space vector modulation method.

10. A direct control system for an internal potential of a bridge arm of a new energy GTI, comprising:

a signal acquisition module, configured to use a three-phase voltage sensor and a three-phase current sensor to collect a three-phase voltage of a filtering capacitor of the three-phase LC filter and a three-phase current of a filtering inductor of the three-phase LC filter, respectively, and take the three-phase voltage of the filtering capacitor of the three-phase LC filter and the three-phase current of the filtering inductor of the three-phase LC filter as an inverter port voltage $v_{abc}$ and an inverter port current $i_{abc}$, respectively;

a power calculation module, configured to calculate an active power p and a reactive power q output by the inverter according to the port voltage $v_{abc}$ and the port current $i_{abc}$ of the inverter;

a state observer module, configured to take the port voltage $v_{abc}$ and the port current $i_{abc}$ of the inverter as inputs, and estimate an internal potential $$u'_\phi$$

of a bridge arm of the inverter by an observer;

a power control module, configured to generate a phase angle reference θ and an amplitude reference U of the internal potential of the bridge arm according to the active power p and the reactive power q;

an internal potential reference production module, configured to calculate an internal potential reference value $u_{\phi-ref}$ through an internal potential calculation formula according to an internal potential phase angle reference θ and an internal potential amplitude reference U;

an internal potential regulation module, configured to compare the internal potential reference value $u_{\phi-ref}$ with an internal potential estimation value $$u'_\phi$$

to obtain a modulating wave $v_{mabc}$; and a PWM module, configured to generate drive signals to control the inverter after the modulating wave $v_{mabc}$ is sent to the PWM module.

* * * * *